(12) United States Patent
Deas et al.

(10) Patent No.: US 6,820,234 B2
(45) Date of Patent: Nov. 16, 2004

(54) SKEW CALIBRATION MEANS AND A METHOD OF SKEW CALIBRATION

(75) Inventors: Alexander Roger Deas, Edinburgh (GB); Ilya Valerievich Klotchkov, St. Petersburg (RU); Igor Anatolievich Abrossimov, St. Petersburg (RU); Vasily Grigorievich Atyunin, St. Petersburg (RU)

(73) Assignee: Acuid Limited, Edinburgh (GB)

( * ) Notice: Subject to any disclaimer, the term of this patent is extended or adjusted under 35 U.S.C. 154(b) by 383 days.

(21) Appl. No.: 09/967,535

(22) Filed: Oct. 1, 2001

(65) Prior Publication Data

US 2003/0208717 A1 Nov. 6, 2003

Related U.S. Application Data

(63) Continuation-in-part of application No. 09/342,227, filed on Jun. 29, 1999, now Pat. No. 6,298,465, which is a continuation-in-part of application No. PCT/RU98/00204, filed on Jun. 29, 1998, and a continuation-in-part of application No. PCT/RU99/00193, filed on Jun. 10, 1999.
(60) Provisional application No. 60/244,179, filed on Oct. 31, 2000, and provisional application No. 60/310,299, filed on Aug. 6, 2001.

(30) Foreign Application Priority Data

Apr. 2, 2001 (GB) .............................................. 0111181

(51) Int. Cl.[7] .......................... G11B 27/00; G11B 5/00; G06F 1/04

(52) U.S. Cl. ........................ 714/814; 714/700; 713/503

(58) Field of Search ................................. 714/700, 814, 714/815, 816, 811, 798; 713/400, 401, 500, 503, 600

(56) References Cited

U.S. PATENT DOCUMENTS

| 4,497,056 A | | 1/1985 | Sugamori |
| 4,570,082 A | * | 2/1986 | Maley et al. ............... 327/205 |
| 4,806,852 A | | 2/1989 | Swan et al. |

(List continued on next page.)

FOREIGN PATENT DOCUMENTS

| EP | 0 078 219 A2 | 5/1983 |
| EP | 0 356 967 A2 | 3/1990 |

OTHER PUBLICATIONS

Bulaga et al., "Maximizing and Maintaining AC Test Accuracy in the Manufacturing Environment," Proceedings of the International Test Conference, Nashville, Oct. 28–30, 1991, pp. 976–985, XP000272337, Institute of Elecrical and Electronics Engineers.

(List continued on next page.)

Primary Examiner—Christine T. Tu
(74) Attorney, Agent, or Firm—Sughrue Mion, PLLC

(57) ABSTRACT

A high speed communication apparatus with means for reducing timing uncertainty providing a high accuracy of transferring and receiving signals by intelligent skew calibration of the apparatus. The system for reducing timing uncertainty of a communication apparatus comprises a plurality of driving registers for transmitting signals; a plurality of receiving registers for receiving signals; a main clock for generating a main clock signal; a reference clock for generating reference signals for calibrating the registers; and a plurality of phase shift means comprising at least one set of phase shift means associated with each said plurality of registers, for the relative alignment of the register's timing within each plurality. The apparatus preferably further comprises a storage means for recording and storing information on skew in a communication media, for at least one data pattern transmitted through the transmission line and a plurality of adjustment means for generating and applying a correction to the timing position of a signal transition between two logical levels, the correction being generated on the basis of the information stored in the storage means, so as to compensate the above skew.

39 Claims, 10 Drawing Sheets

U.S. PATENT DOCUMENTS

| | | | |
|---|---|---|---|
| 4,903,024 A | | 2/1990 | Evans et al. |
| 5,036,221 A | * | 7/1991 | Brucculeri et al. ........... 326/94 |
| 5,243,456 A | * | 9/1993 | Hirakata ..................... 398/189 |
| 5,712,855 A | | 1/1998 | Goto et al. |
| 5,717,704 A | | 2/1998 | Rosenfeld |
| 5,764,598 A | | 6/1998 | Okayasu |
| 5,811,655 A | | 9/1998 | Hashimoto et al. |
| 5,854,797 A | | 12/1998 | Schwartz et al. |
| 5,884,236 A | | 3/1999 | Ito |
| 5,935,256 A | | 8/1999 | Lesmeister |
| 6,073,259 A | | 6/2000 | Sartschev et al. |

OTHER PUBLICATIONS

"Calibration Method for Testers," IBM Technical Disclosure Bulletin, vol. 34, No. 11, Apr. 1992, p. 182.

* cited by examiner

SKEW CALIBRATION MEANS AND A METHOD OF SKEW CALIBRATION

This is a Continuation-in-Part of application Ser. No. 09/342,227 (Confirmation No. Not Assigned) filed Jun. 29, 1999, which is a continuation-in-part of PCT application PCT/RU98/00204 filed Jun. 29, 1998 and PCT/RU99/00193 filed Jun. 10, 1999.

This application also claims priority from U.S. Provisional Application No. 60/244,179 filed on Oct. 31, 2000 and from Provisional Application No. 60/310,299 filed Aug. 6, 2001.

This application is based upon earlier filed applications PCT/RU98/00204, filed Jun. 29, 1998, PCT/RU99/00194, filed Jun. 10, 1999, and GB 0111181.4 filed on Apr. 2, 2001, the disclosures of which applications are herein incorporated by reference.

TECHNICAL FIELD OF THE INVENTION

The present invention relates to automatic test equipment (ATE) for semiconductor device testing, and more specifically, to an apparatus, e.g. tester, for testing and measuring a semiconductor device, such as a memory and to a method of timing calibration. In particular, the invention relates to the accurate and automatic calibration of ATE input and output pin driver timing.

The present invention is particularly applicable to test equipment for testing semiconductor memories and logic to make possible the precise and continuous testing of logic and memory devices at wafer probe stage, or as dies or packaged parts, or in modules or circuits.

BACKGROUND OF THE INVENTION

Test systems used for testing semiconductor devices should be able to test each new generation of devices at the maximum speed of the new device. A testing apparatus for a digital circuit generates various waveforms at a desired timing and detects the voltage level of the waveforms, usually comparing data read from the device under test with what is expected. The timing system is one of the most critical specifications of a tester. At present, typical systems provide a 60-ps resolution, 500-ps maximum driver-to-driver skewing and 700-ps maximum edge placement error. The overall timing accuracy is within ±1.5 ns. For the new generation of high-speed devices, the accuracy should be within a few hundred picoseconds. To achieve this increased accuracy, it is essential to calibrate the timing of the testing apparatus.

The invention is particularly appropriate for memory devices. Semiconductor memories tend to have a large number of input and output pins, for example, 36 pins, and are tested 16 or 32 at a time, requiring 36×32 tester pins. Consequently, the tester requires a large number of units of a per-pin structure, each of which needs timing calibration, since it is necessary to ensure that the timing of all voltage transitions delivered to the pins of the DUT, and the time at which data output from the device is compared with expected data, are accurate in relation to a defined reference. However, these transitions often occur at different times, due to the fact that signals travelling a channel path to a DUT must pass through cables, formatters, drivers and other devices having different electrical characteristics. The resulting timing variations are called "skew". Generally, calibration involves measuring the skew in each system input and output channel and compensating for it by means of a variable delay in each channel (e.g., see U.S. Pat. No. 5,274,796). Hardware, software and a combination thereof can be used to control the compensating delay.

The traditional approach involves serially calibrating tester pin timing with respect to a reference pin or an external reference (see, e.g. U.S. Pat. No. 5,712,855). Since pin calibration measurements must be performed sequentially, an enormous amount of time is needed for this method. The amount of measured data required is also large; thus, the transfer and calculation time is undesirably long.

Another conventional approach which alleviates the above problems is described in U.S. Pat. No. 5,477,139, wherein the calibration is performed in parallel. This method shortens the time required for timing measurements, however, it increases the cost of the whole measuring apparatus, as it uses a number of local sequencers, one for each pin of the device under test (DUT).

Another means to execute the skew adjustment in parallel for all terminals of the IC tester is described in EP 356,967 A2. The disadvantage of the known method is that the skew adjustment is performed manually by an operator.

Another widely used calibration technique uses time domain reflectometry (TDR) based on transmission line theory. According to this theory, a wave travelling through a transmission line terminated by anything other than the line's characteristic impedance is reflected back through the line. If the line terminates with an open circuit, the reflected wave equals the forwarded wave and this reflected wave is detected by the pin electronics. Using TDR techniques, automatic calibration circuits are provided to measure channel delays to the open circuited contact points of the tester. However, this approach has the disadvantage of requiring many delay compensation circuits per pin driver.

A method of autocalibrating a tester's timings with respect to a common reference point is described in "Maximizing and maintaining AC test accuracy in the manufacturing environment" by R. J. Bulaga and E. F. Westermann, Proceedings of the International Test Conference, Nashville, 1991, p.p. 976–985, IEEE. However, the known method is adapted for calibrating the skew of non-cyclic, e.g. asynchronous, test signals, requires the use of multiple bulk hardware and makes the system dense, and cost-ineffective. It takes about 30 seconds to perform a complete calibration, which is slow for conventional memories.

An automatic skew calibration circuit described in U.S. Pat. No. 5,384,781 provides a calibration technique for multi-channel signal sources using a means for varying the delay in response to a skew signal and determining a calibrated value for the delay. The circuit comprises a pair of cross-coupled flip-flops and a microprocessor. This method takes account of the variations in the time at which different flip-flops change state. It provides a fast calibration method which may be performed easily and frequently to correct the skew errors in signal sources. However, the technique becomes extremely complicated when the number of signal sources increases; moreover, it is not cost-effective in semiconductor memory test equipment with a large number of signal sources.

One of the main limitations of the known approaches to signal skew calibration is that the accuracy of measuring the signal skew decreases with the increasing speed and complexity of each new generation of high-speed synchronous devices. In a modern context, not only input/output signal skew compensation is needed, but also a significant improvement in the accuracy of measuring the skew itself, where there are multiple error sources and skew compensating delays. The necessity of increasing the accuracy of skew calibration creates a requirement for a fast, automatic calibration system providing extremely precise automatic calibration in test systems with multiple signal sources.

SUMMARY OF THE INVENTION

The object of the present invention is the provision of an ATE system that can perform highly accurate semiconductor testing by maintaining the precise timing characteristics of registers and providing precise calibration in relation to multiple signal sources, while at the same time reducing test time and tester cost and simplifying header characterization.

The advantage of the present invention is the ability of an ATE system using a skew calibration circuit incorporated in the tester's header to reduce or substantially eliminate the timing skew between different signal sources and thus to enhance the accuracy of testing and provide acceptable and adequate testing of high-speed synchronous memory devices. According to the proposed invention, registers for latching data to and/or from the DUT are positioned in the test head or on the header, a card holding probe pins or sockets, to reduce the signal path to and/or from the DUT and thus avoid excessive distortion of the timing signal. Skew control may be performed by calibrating the tester's registers only. The overall system is thus greatly simplified because it is not necessary to use programmable delays for each pin and the number of units to be calibrated is reduced, in comparison to conventional systems which require calibration of each pin driver. By using a common reference clock driver to calibrate the output registers, the delay between the moment when the register actually latches input data and the reference clock edge may be measured with greatly increased accuracy. An important advantage of the proposed system is that it also allows fast calibration to be carried with each DUT. This is especially important because various characteristics of a DUT itself may interfere with the operation of the registers and influence the accuracy of skew calibration.

The substance of the present invention is an automatic skew calibration means for skew calibration of a transceiver, for example, for calibrating the skew of signals transmitted to the DUT and received from the DUT in the course of a testing procedure, thus providing highly accurate testing of synchronous memory devices. The calibration is performed using a common time base which is available at different points on the calibration circuit, by which a reference signal is distributed from the reference clock source to the output registers.

The proposed means may be incorporated in the tester's header or may be implemented as a separate unit connected to the tester's header.

The number of input and output registers is defined by the number of registers in the DUT to be tested and may be one hundred or more. The registers may be implemented in, for example, but not limited to, flip-flops, latches or any other suitable means for latching signals.

A conventional clock generator may be used as a main clock source. The reference clock circuit may contain a plurality of phase shift means, e.g. a set of programmable delays, to provide a means for delaying the signal with respect to the main clock. The main clock source may be implemented, for example, by a PLL (Phase Lock Loop) clock generator, e.g. SY89429A manufactured by Synergy Semiconductor Corp. (U.S.A.), or by Analogue Devices, or similar fabrications by Vitalec or Edge Semiconductors.

The important feature of the present invention is that the DUT may be connected to the calibration means during the calibration operation, thereby allowing the electric characteristics of the DUT to be taken into account. The DUT characteristics, for example capacitance, may be measured after calibrating the tester. This feature is especially significant for CMOS logic, where timing is load capacitance dependent. Moreover, unlike conventional testers, which require the tester's header to be changed whenever a new type of DUT is to be tested, the present invention allows the same tester to be used for testing different types of DUTs. In general, the proposed calibration means may be used for calibrating the timings of different systems for transmitting and receiving signals, typically called transceivers. A particular case of a transceiver is an electronic circuit tester for testing semiconductor devices.

Thus, in one aspect, the invention is an automatic skew calibration means for calibrating the timings of a transceiver, in particular, a semiconductor device testing apparatus, comprising:

a plurality of input registers for transmitting signals;

a plurality of output registers for receiving signals;

a main clock means for generating a main clock signal;

a reference clock means for supplying reference signals for calibrating the registers, the said reference clock means being associated with the said main clock means; and a first plurality of phase shift means, comprising at least one set of phase shift means associated with each plurality of registers, for relative alignment of the register's timing within each plurality.

The calibration means comprises a transmission line having predetermined wave characteristics, for distributing a reference signal from the reference clock means to the output registers.

Preferably, each the said set of phase shift means comprises at least one shift means associated with each separate register, for delaying the timing of that register.

To further enhance its accuracy, the skew calibration means preferably additionally comprises:

a second set of phase shift means associated with the said pluralities of registers, to allow the relative alignment of the register's timing between the said pluralities, the said plurality of input registers and the said plurality of output registers being connected to the main clock means via the second set of phase shift means. An important feature of the present invention is that the said plurality of output registers is operable to calibrate the said plurality of input registers.

Preferably, the said second set of phase shift means comprises at least one shift means associated with each plurality of registers.

Preferably, the said output registers are series-connected to the said reference clock means by the said transmission line.

Preferably, at least one or, more preferably, all of the components including the said plurality of input registers, the said plurality of output registers and the said reference clock means are parts of a tester header.

Another aspect of the present invention is a method of automatic transceiver skew calibration comprising:

calibrating a plurality of transceiver output registers with respect to a reference clock edge;

calibrating the propagation delay of the input registers of the transceiver using the calibrated output registers; and relative alignment of the measured delays to the main clock edge.

Preferably, the method further comprises, before the said operation of calibrating the output registers, an operation of calibrating each programmable delay.

The method preferably further includes a step of increasing the accuracy of the test system in which the transceiver is used by determining the minimal feasible time delay between the reference clock edge and the moment when the register latches data. The calibration may be performed for each register or for pluralities of registers. It should also be noted that the measurements may be carried out for each bit of data transferred to or from the register.

Another aspect of the present invention is a test system for testing semiconductor devices comprising a timing means, a fault logic, and a central control unit, and also a set of input registers and a set of output registers, the said registers being calibrated using the calibration means and/or the calibration method proposed in the present invention. The test system may be calibrated in relation to a particular device under test to take into account the device characteristics that may interfere with the operation of the test system. Preferably the test system has the built-in calibration means proposed in the present invention. In particular, the calibration means may be incorporated in the tester's header.

Another aspect of the present invention is a method of testing semiconductor devices including a step of transmitting a pattern of signals for accessing memory elements within the device, a step of receiving response signals for detecting failures in the memory elements and a step of processing test results, the method including a step of automatic skew calibration using the calibration means proposed in the present invention. Preferably, the skew calibration includes a step of determining the minimal feasible time delay between the reference clock edge and the moment when the register latches input data.

Still another aspect is a computer program for implementing, simulating or emulating the hardware functions of the skew calibration means or for computer implementation of the method in accordance with the present invention.

BRIEF DESCRIPTION OF THE DRAWINGS

For a better understanding of the present invention and the advantages thereof and to show how the same may be carried into effect, reference will now be made, by way of example, without loss of generality, to the following description now taken in conjunction with the accompanying drawings in which.

The invention will now be described, without loss of generality, with the aid of example embodiments.

DETAILED DESCRIPTION OF THE INVENTION

Figure 1:
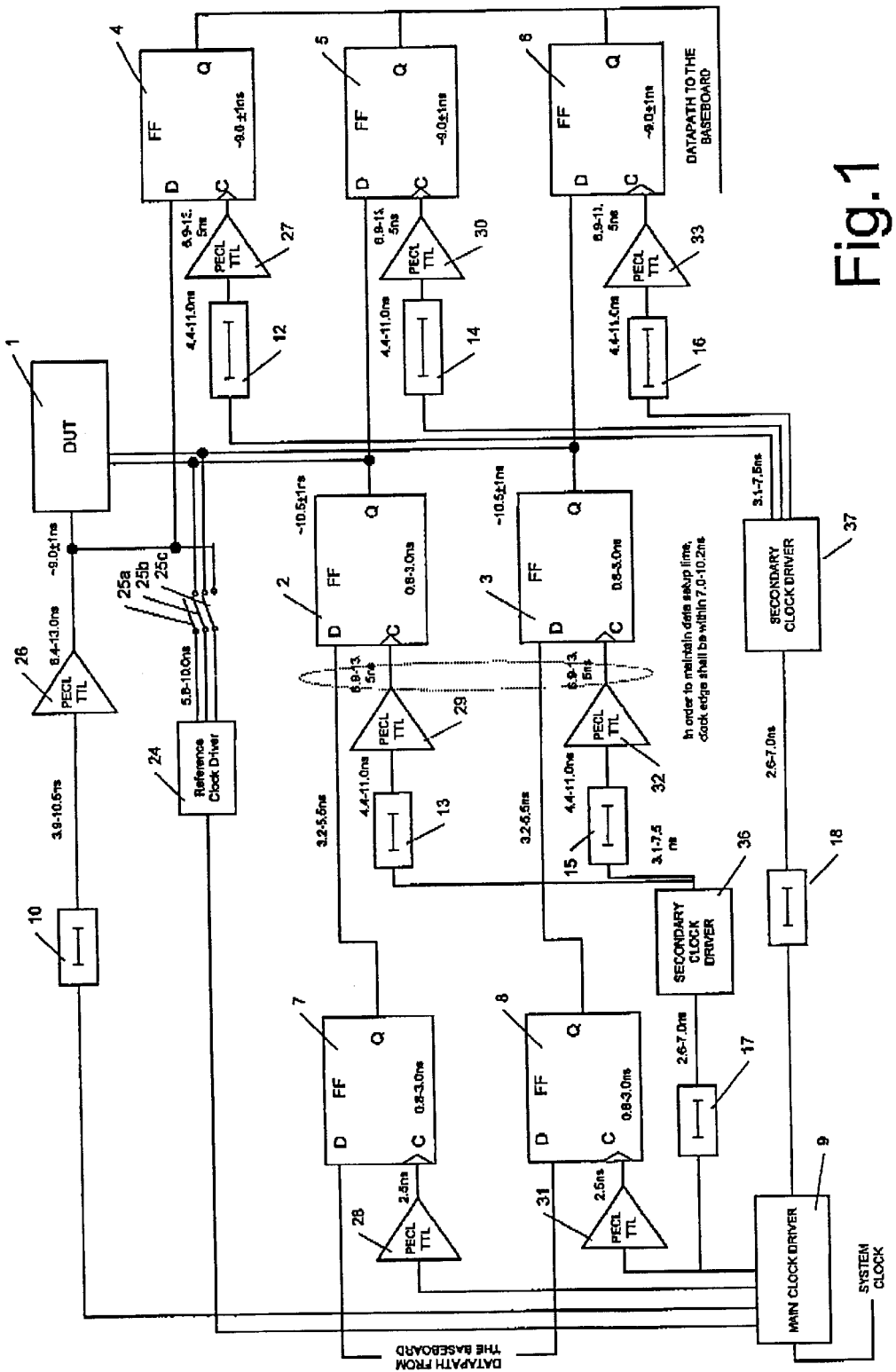
FIG. 1 is a fragmentary circuit diagram of the skew calibration means in accordance with one of the embodiments of the present invention.
Figure 6:
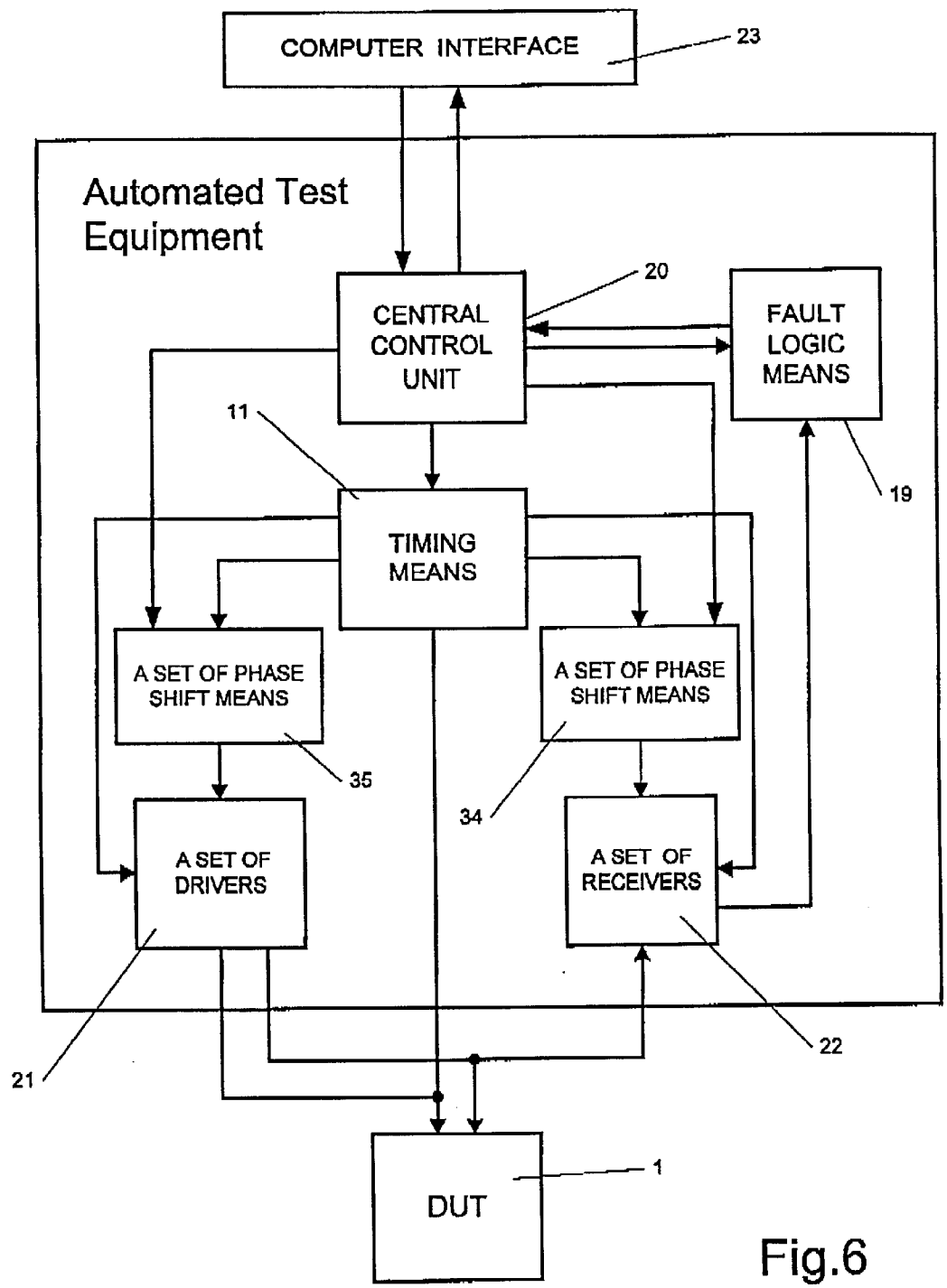
FIG. 6 shows a schematic block diagram of the test system in accordance with the present invention.

In FIG. 1 a fragmentary block scheme of a tester header with a built-in skew calibration means in accordance with one of the embodiments of the present invention is shown. The remaining circuitry partially shown in FIG. 6 is conventional circuitry containing different elements, such as formatters, master clocks, programmable delays, switches, etc, which are utilised to generate the test signals. The calibration means of the present invention is adapted for providing calibration of test data between the actual transmitting and receiving registers and the DUT. Typically used registers include conventional flip-flops and latches.

Illustrated in FIG. 1 are a plurality of input registers 2–3 for transmitting test signals to the device 1 under test (DUT), including data, address and control signals transmitted from the registers, and a plurality of output registers 4–6 for receiving response signals from the DUT. The clock signals are transmitted to the DUT from the main clock driver via, sequentially, a programmable delay 10 and a logic translator means 26.

The outputs of the input registers 2,3 are connected to the DUT 1 and to the inputs of the output registers 4–6. The clocks of the input registers 2, 3 are connected via logic translator means 29, 32 and delays 13, 15, respectively, to the output of the secondary clock driver 36 for maintaining data setup time for the input registers and DUT. To achieve this, the input of the secondary clock driver 36 is connected via programmable delay 17 to the main clock driver 9.

The clocks of the output registers 4,5,6 are connected via logic translator means 27, 30 and 33 and delays 12, 14 and 16 to the output of the secondary clock driver 37. The input of the secondary clock driver 37 is connected via programmable delay 18 to the main clock driver 9 for alignment of the fault strobe to the DUT clock. One more set of registers 7–8 is adapted to allow the signal entering the input registers to be independent from the path length from the baseboard; the inputs of the registers 7–8 are connected to the baseboard, while their outputs are connected to the inputs of the input registers 2–3. The clocks of the registers 7,8 are connected via logic translator means 28 and 31, respectively, to the main clock driver 9. It should also be noted that the number of registers is not limited and may be, for example, one hundred or more. A main clock driver 9 is provided for generating timing signals for the tester. Preferably, the main clock driver 9 generates clock signals at different frequencies.

To perform the calibration of the tester, programmable delays 12, 14, 16 are provided to compensate for the differences in signal paths from the DUT and delays 13, 15 are provided to compensate for the differences in signal paths to the DUT. Generally, the set of phase shift means (e.g., programmable delays) may comprise, for example, one or more shift means for relative alignment of the registers's timing within each plurality, i.e. the number of delays may be less or greater than the number of registers within each plurality.

Preferably, at least one calibration shift means is used for delaying the timing of each separate register within the plurality, as shown in FIG. 1; i.e. delays 13,15 are used for calibrating the timing of the input registers 2,3, respectively, while delays 12,14,16 are used for calibrating the timing of the output registers 4,5,6 respectively.

Another set of phase shift means, in this case, including delays 10, 17 and 18, is reserved for shifting secondary clocks in relation to main clock to provide individual fan-out for the registers. The second set of phase shift means is also used for relative alignment of the register's timing between the said pluralities. Preferably, at least one delay from the second set of delays is associated with each of the plurality of registers. As seen in FIG. 1, both the plurality of input registers and the plurality of output registers are connected to the main clock means via the said second set of phase shift means.

Any suitable means may be used for phase shifting, e.g. as already mentioned above, conventional programmable delays. The delays may be implemented, for example, using a SY100E195 manufactured by Synergy Semiconductor Corp. (U.S.A.), or by Analogue Devices, or by Edge Semiconductor Devices.

In order to maintain the timing skew within the predetermined accuracy during the testing operation and in case a new type of memory device is to be tested, it is necessary to be able to calibrate the test system periodically to determine whether any changes have occurred as a result of temperature variations, aging, or any other factors. To perform the calibration operation, a reference clock driver 24 for supplying the reference clock signal for the registers is incorporated in the circuit and connected to the registers through reference clock switches 25a, 25b and 25c. During normal operation mode, switches 25 are open and the reference clock is disconnected from the data lines.

Figure 2A:
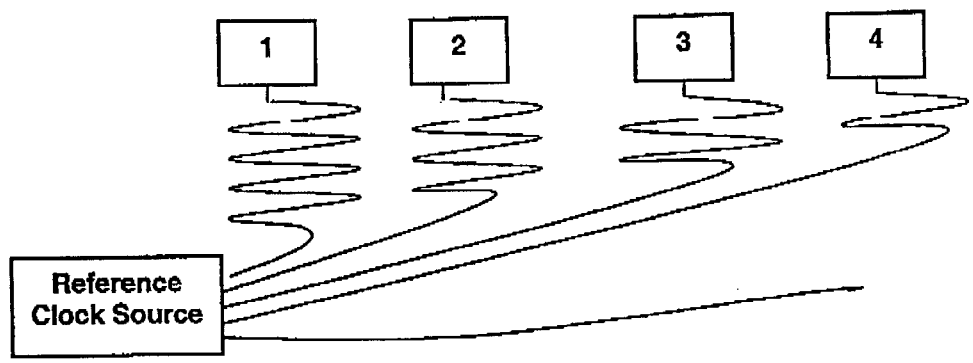
FIG. 2a illustrates a method of introducing a common node according to a prior art method.
Figure 2B:
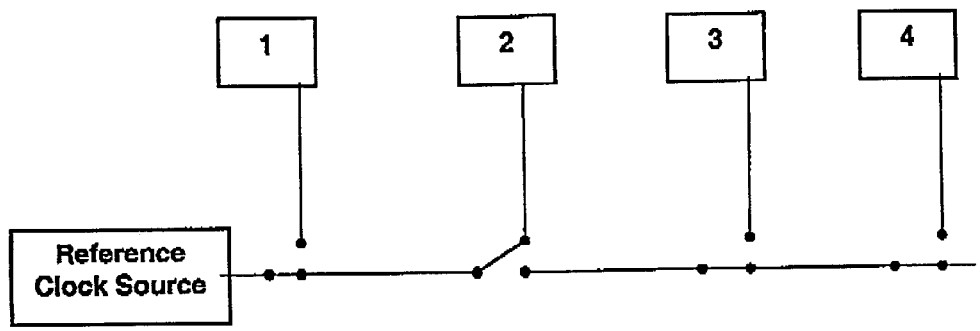
FIG. 2b illustrates the transmission line for introducing a common time base according to the invention.
Figure 2C:
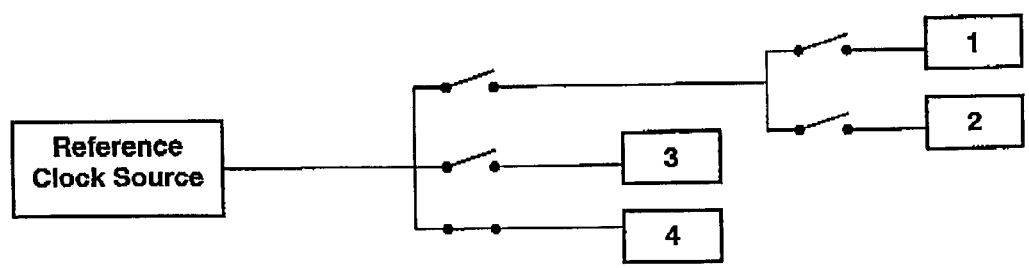
FIG. 2c illustrates the transmission line with a series of switches for introducing a common time base according to the invention.

It should also be noted that the common time base, i.e. the main clock, is introduced into the calibration circuit in accordance with the present invention by means of a "distributed common node". In a typical skew calibration circuit, e.g. as described in U.S. Pat. No. 4,827,437, a common node is introduced by means of multiple cables disposed between the node and each test terminal, each of the cables identical in length and internal impedance (see FIG. 2a). According to the present invention, a common transmission line of known wave characteristics is used to create the common time base which is available at different points in the circuit, as shown in FIG. 2b. Thus, each point connected to the transmission line is provided with a common time base which may easily be calculated from the signal propagation rate in this transmission line. As a result, there is no necessity to use cables of equal length to provide a common time base. The transmission line may be provided with a series of switches to commutate registers as desired, as shown, for example, in FIG. 3c. Different switch patterns can be created as it is evident for a specialist in the art.

Referring to FIG. 1, the reference clock signal is distributed from the reference clock driver 24 to the registers 4,5,6 via a common transmission line. Each output register 4,5,6 is series-connected to the said transmission line, permitting a transmission line of a minimal length to be used and thus minimising the signal fluctuations along the line.

If necessary, as shown in FIG. 1, a number of logic translator means 26–33 of a PECL-to-TTL type, e.g. SY100ELT23 manufactured by Synergy Semiconductor Corp. (U.S.A.), may be provided for translating PECL signals used in the clock circuit into TTL signals used in the DUT circuit. However, in particular applications these translators may not be needed and may be omitted.

The operation of the skew calibration means will now be described in more detail.

The calibration procedure is performed in four operations comprising:

(1) calibrating each programmable delay to determine its actual delay characteristics;

(2) calibrating a plurality of output registers in relation to the reference clock edge;

(3) calibrating the propagation delay of the input registers using the calibrated output registers;

(4) providing relative alignment of the measured delays to the main clock edge.

The first three of these four calibration operations are performed using a special calibration technique proposed in the present invention. The technique comprises varying the programmable delay using a system sequencer (not shown) to cover the whole delay range and determining for each bit of the register the probability that it will be in one of the possible states, i.e. the "0" or "1" state. The calibration is performed by incrementing the corresponding delay from zero to maximal value; the result $S_i$ of i-determination for a given bit of a given register is calculated R times at given conditions, each determination being repeated until a statistically sufficient number R of meanings is obtained. The flow chart of this calibration operation is shown in FIG. 3, where $\Sigma S_i/R$ is an averaged result of the above determination.

Figure 4A:
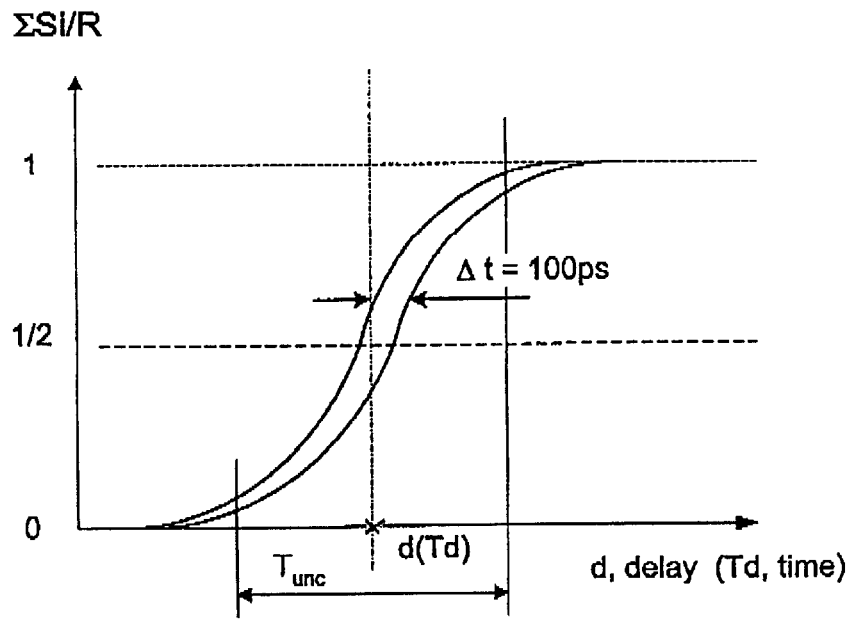
FIG. 4a shows a graph of the step of calibration of registers performed by incrementing the delay corresponding to the register from zero to maximal value.

On the basis of the data obtained, a graph is plotted showing the point where the above probability is equal to 50%. The graph of this calibration operation is illustrated in FIG. 4(a).

Figure 3:
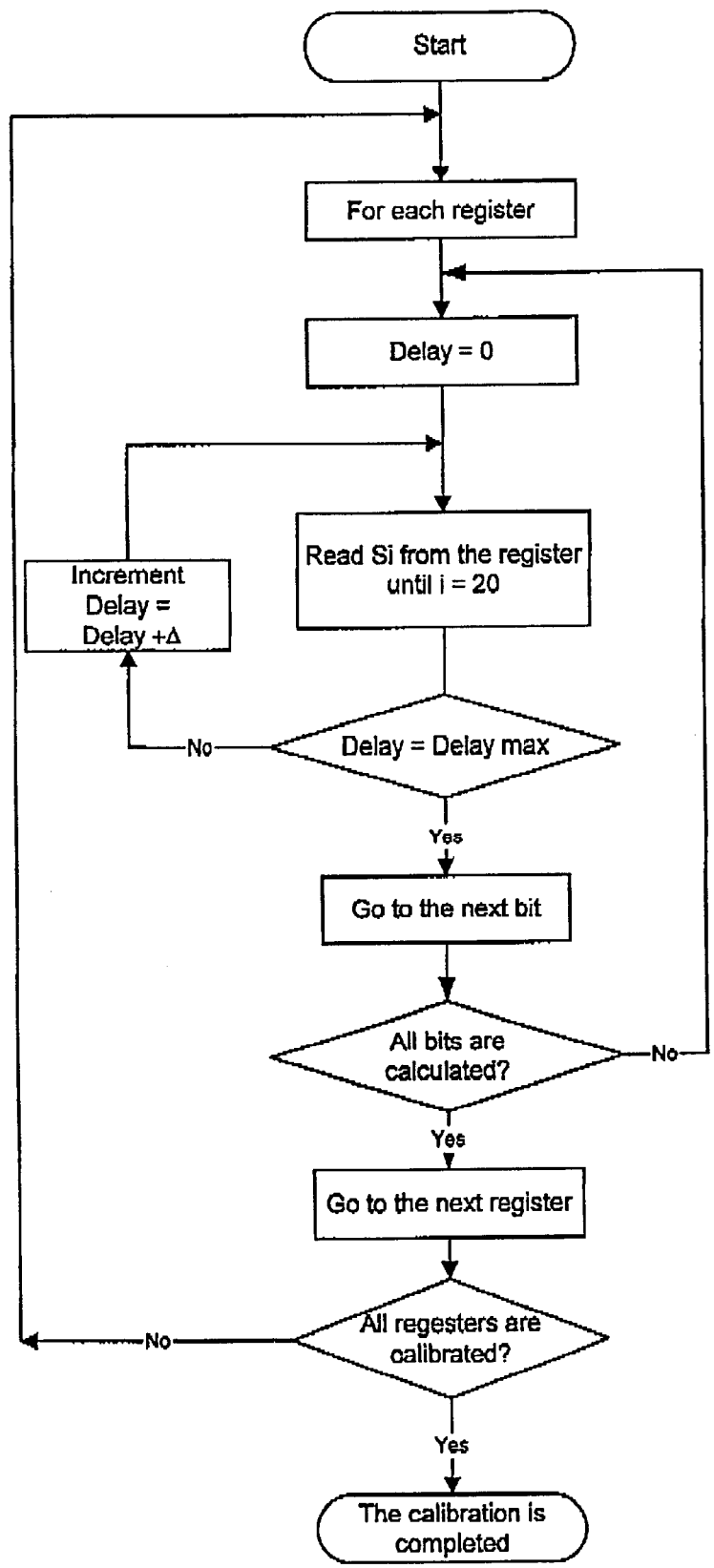
FIG. 3 is a flow chart diagram of the operation of a skew calibration means in accordance with the present invention.

A computer program can be easily created in any suitable language, e.g. C, C++, Assembler, etc, to implement the above calibration operation on the basis of a flow chart represented in FIG. 3.

I. Calibration of Programmable Delays

The first operation of the calibration procedure can be omitted in certain cases and it is preferably performed before the calibration of the registers. The operation comprises a preliminary calibration of the programmable delays that are used for calibration of registers, and ensures a high precision calibration.

Figure 4B:
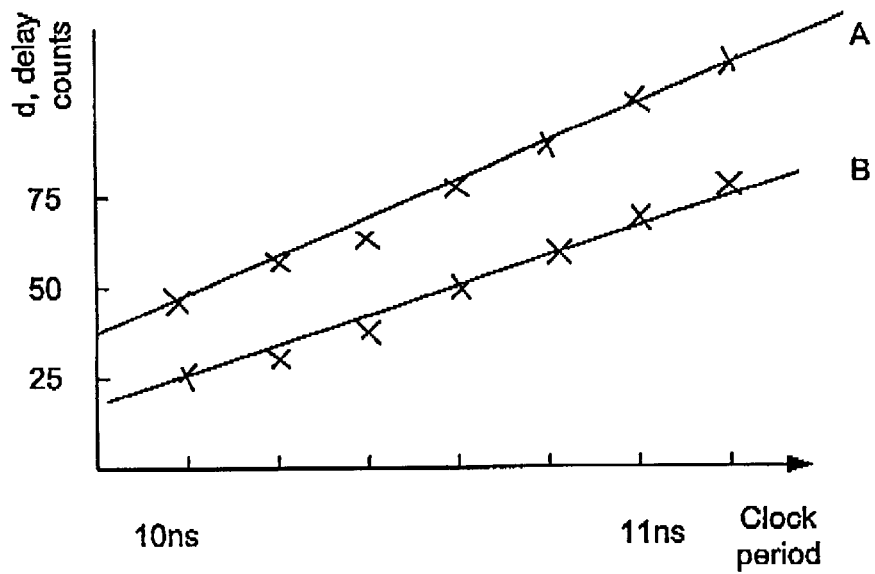
FIG. 4b shows a calibration graph for a programmable delay and illustrates the first step of calibration according to the present invention.

Programmable delays are characterised by the linear dependence of the delay value on a code that is sent to the delay (a typical graph of this dependence for delays A and B is shown in FIG. 4(b)). As shown in the figure, the slope of this linear graph varies from one delay to another within the same batch. It is also known that the calibration frequency influences the moment at which the transition occurs from one of the two possible states to the other. Inaccuracy caused by this influence is accounted for at this step. To define the delay characteristics accurately, each programmable delay is calibrated in situ after being installed in a calibration circuit but before the calibration of the registers. The delays are calibrated by varying the calibration frequency while keeping other variables constant, that making it possible to determine the threshold of the variable delay by fixing the difference in time of the two transition moments.

It should also be noted that in the course of this procedure a calibration graph is obtained with x, y coordinates, where 'x' is the clock period and 'y' the discrete delay unit (d, delay counts). To define the linear dependence in terms of time units (Td) along the y coordinate, the value of this discrete unit is determined in time units by the standard method of linear regression. Thus, each variable delay is assigned a transfer function $F_{tr}$ showing the dependence of the delay value on the code that is sent to the variable delay.

II. Calibration of Output Registers

The second operation is the calibration of each or at least some of the output registers in relation to the reference clock edge (although in this case, registers 4, 5 and 6 are shown in FIG. 1, it shall be understood that in practice the number of registers may be one hundred or more.) During the calibration operation, one of the switches 25 is closed, depending on which bit of the register being calibrated is to be measured. For example, to calibrate register 6, the middle switch 25b shall be closed and input registers are tri-stated. Then the corresponding programmable delay 16 is varied to cover the whole delay range in accordance with the calibration procedure described above. In this case, the procedure is performed at the same frequency for different bits of the register.

This operation may be omitted in the case of new generation high-precision registers, or where registers specially manufactured for this purpose are provided, or where pre-calibrated registers are used. Conventional registers may also be used without adjustment, but there will be a certain decrease in the overall accuracy of the system.

Figure 5:
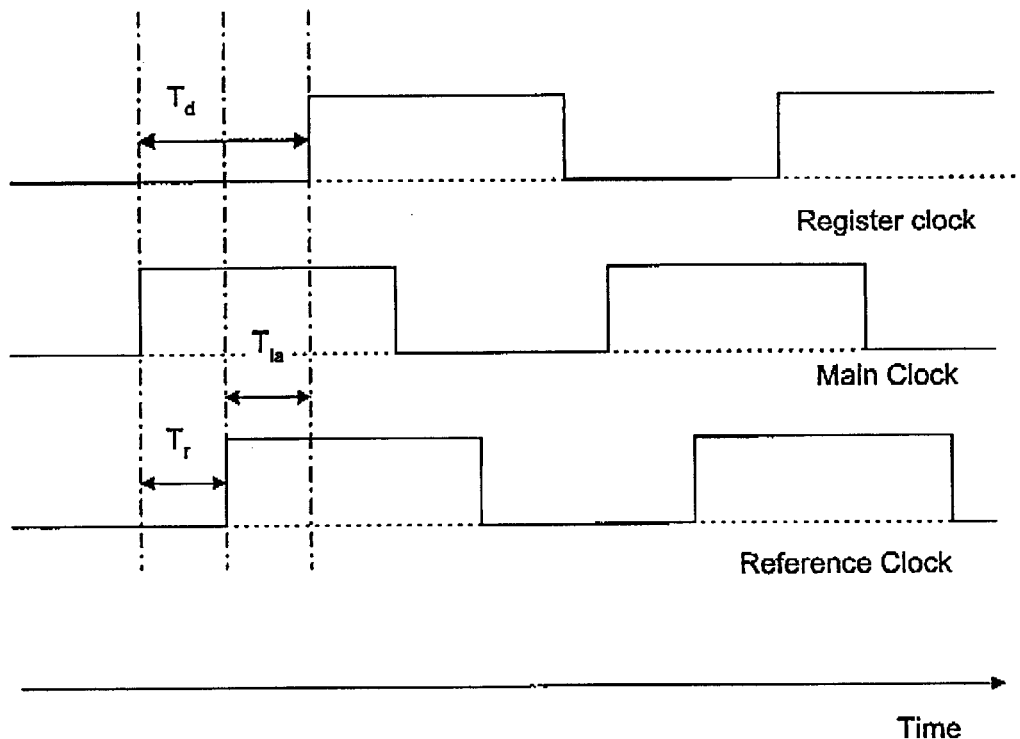
FIG. 5 is a timing diagram illustrating the skew calibration method in accordance with the present invention.

A timing diagram of this calibration operation is illustrated in FIG. 5. As shown in FIG. 5, a certain difference in time is observed between the moment when the register actually latches input data and the reference clock edge. At the end of the calibration procedure, corresponding delays, i.e. Td for a given bit in a given register, are introduced into the input and output channels to compensate for these time differences, Td being defined by the following formula:

$$T_d = T_{la} + T_r$$

where $T_d$—actual value of signal delay;

$T_{la}$—an exact time of data latching in the register;

$T_r$—time required for the reference clock signal to reach a given bit of a given register via a transmission line. This time may be calculated from the PCB (printed circuit board) layout and/or checked and corrected by oscilloscope measurements.

However, uncertainty in determining the length of the delay to be nulled limits the accuracy of the calibration operation and, therefore, this uncertainty shall be minimised. Parameter $T_{la}$, representing the exact time of data latching in the register, is defined by an average of the setup and hold times for an actual register under given power supply and temperature conditions. However, this parameter may differ from the parameters indicated in datasheets, as these usually give the worst case values over temperature and power supply. Determining the actual time when the register latches the input data and the actual delay between this moment and the reference clock edge enables the accuracy of the test system operation to be increased. The determination is performed either for the falling edge, or for the rising edge of the reference clock, or it may be performed twice, once for the falling edge, and again for the rising edge to assure the accuracy. The accuracy of determining $T_d$ (time of delay) and therefore, $T_{la}$, as $T_r$ (time of reference clock edge) is a function of two values: register clock jitter and latch time uncertainty itself. Because of the difficulty of achieving an accurate calculation of the jitter and latch time window of uncertainty, the sum of these two values is determined experimentally. It has been found that the delay $T_d$ may be determined with an accuracy of 250 ps for both rising and falling edges of data at the input of typical TTL registers. Greater accuracy is available from some CMO Gallium Arsenide and ECL registers.

The accuracy of calibration of the output registers can now be determined on the basis of the experimental data. It is limited by the uncertainty of the actual time when the register latches data and is calculated as follows:

$$\Delta T_{sk(out)} = \Delta T_{sk(o)} + \Delta T_{unc},$$

where $\Delta T_{sk(o)}$ is the output skew of the reference clock driver which is equal to about 0.3 ns for a typical clock driver, e.g. SY100E111 manufactured by Synergy Semiconductor Corp. (U.S.A.). This skew can be reduced during the manufacturing process, but for the purposes of the present description it may be assumed that standard devices are used without adjustment. Alternatively, a single line having predetermined signal propagation parameters may be used. In this case, $\Delta T_{sk(o)}$ may be determined from the PCB (printed circuit board) layout and will be less than 0.3 ns;

$\Delta T_{unc}$ is the uncertainty of determining the difference in time between the moment when the register actually latches input data and the reference clock edge, and is determined to be in this case ±0.25 ns. This could also be measured as noted above. Though this accuracy may be assumed sufficient for the example embodiment of the present invention, in general, the proposed calibration means provides a scalable system capable of being adjusted to whatever increased accuracy may be desired when using registers with a higher inherent accuracy.

As for the main clock driver jitter, it is negligible, since the main clock driver is commonly implemented in a positive emitter coupled logic (PECL). Commercial Hybrid oscillators are able to achieve a 3 ps RMS (Root Mean Square) jitter. It shall also be noted that the output skew of the main clock driver is in any case compensated for in the course of the proposed calibration operation due to the averaging of data. Thus, typically, $$\Delta T_{sk(out)} = 0.30 + 0.25 = 0.55 \text{ ns.}$$

Thus, the output registers are calibrated with an accuracy of at least 0.55 ns, preferably less than 0.55 ns.

III. Calibration of Input Registers

The third skew calibration operation is the calibration of the propagation delay of each of the plurality of input registers 2,3. To perform the third operation of the calibration, the reference clock driver 24 is disconnected from the calibration means by opening all the switches 25.

Then, input registers 2,3 are forced by the timing generator to produce either low-to-high or high-to-low transition on their outputs. The measurements may be performed for each individual bit of data transmitted from the output register, for which the best match with the latch time of the input registers 2–3 is found by varying the corresponding delays 13 or 15. A similar procedure is performed to find the best match the data transmitted from output register 4 with the latch time of clock driver 26. As a result, $Td_{(DUTclk)}$ is obtained. Although the delay shifts clock for the whole register, individual bits may be monitored and individual propagation delays may be obtained for each output bit of data from the input register. The accuracy of this measurement is limited by the accuracy with which delays have been determined at the previous step and may be calculated as follows:

$$\Delta T_{sk(in)} = \Delta T_{sk(out)} + \Delta T_{unc},$$

where $\Delta T_{sk(out)}$ is the accuracy of calibration of the output registers and is about 0.55 ns, as calculated above; $\Delta T_{unc}$ is the uncertainty of determining the difference in time between the moment when the register actually latches input data and the reference clock edge, in this case, ±0.25 ns.

$$\Delta T_{sk(in)} = 0.55 + 0.25 = 0.80 \text{ ns}.$$

Thus, the input registers can be calibrated with an accuracy of at least 0.80 ns, preferably less than 0.80 ns.

IV. Relative Alignment of the Measured Delay

The final calibration operation is the relative alignment of the measured delay to the main clock.

After completion of the calibration procedure, the DUT clock is chosen as the reference clock to represent the calibration results. The corresponding delay compensation values, Tcomp, are input by the central control means into the programmable delays. This compensates for the major part of the skew.

However, there is still some remainder internal register skew, i.e. skew between pins of the same register (the number of pins may be, e.g. from 4 to 18), that cannot be compensated for in the course of the calibration procedure. For estimation of this skew by the user and for the purposes of convenience, this skew is measured to report it to the user together with the calculated compensation values. Skew of the each signal is calculated in relation to the DUT clock which is thereafter assumed to be zero. The following procedure is performed to determine the compensation values of the delays, wherein k is a bit number within a given plurality of registers, all bits within this plurality being numerated serially from the first bit of the first register to the last bit of the last register;

n is an input register's number within the given plurality of input registers, the total number of input registers being N;

m is an output register number within the plurality of output registers, the total number of output registers being N+1, which exceeds by one the number of input registers due to the presence of clock driver 24 which output is connected to the input of one of the output registers.

Step 1

The following data are input to determine the compensation values of the delay:

calibration graphs in digital form, obtained at operation II for each $m^{th}$ output register and for each $k^{th}$ bit of the output register;

individual reference clock delay values $Tr_k$ measured for each $k^{th}$ bit of the output register;

Step 2

Determine $Td_k$ for each bit k as $Td_k = d_k \times F_{tr}$, where $F_{tr}$ is a transfer function which is determined at operation I and $d_k$ is defined by 50% level for each $k^{th}$ bit for the $m^{th}$ output register;

determine $Tla_k = Td_k - Tr_k$ for each $k^{th}$ bit of the output register;

Step 3 determine an average meaning of $Tla_k$ of all bits for $m^{th}$ output register as $$<Tla>_m = \sum_{k=k_m}^{k_{m+1}-1} Tla_k / (k_{m+1} - k_m),$$

where $k_m$ is the first bit number of the output register m;
determine $\min<Tla>_m$;
calculate compensation delays as $$Tcomp_m(out) = <Tla>_m - \min<Tla>;$$

Step 4 (Determining Propagation Time for Each Input Register)

for each $n^{th}$ input register take $Td_k(in)$ determined in operation III;

for each $n^{th}$ input register take $Tla_k(out)$ determined in Step 2 for each $m^{th}$ output register which input is connected to the output of the $n^{th}$ input register;

calculate $Tco_k(in) = Td_k(in) - Tla_k(out)$; where Tco is "clock-to-output", i.e. propagation time;

calculate an average meaning of $Tco_k$ of all bits for $m^{th}$ output register as $$<Tco>_n = \sum_{k=k_n}^{k_{n+1}-1} Tco_k / (k_{n+1} - k_n);$$

determine $\min<Tco>_n$;
calculate a set of compensation delays for each input register as $Tcomp_n(in) = <Tco>_n - \min<Tco>_n$;

Step 5 take $Td(DUTclk)_k$ determined at operation III for DUT clock driver when the reference clock is switched off and the DUT clock is connected to the output registers;

take $Tla(DUTclk)_k$ for the output register which input is connected to the output of the DUT clock driver;

calculate $Tco_k(DUTclk) = Td_k(DUTclk) - Tla_k(DUTclk)$; where Tco is "clock-to-output", i.e. propagation time;

calculate an average meaning of Tco(DUTclk) for each $k^{th}$ bit of the clock driver as:

$$<Tco(DUTclk)> = \sum_{k=DUT}^{k_{DUT}+L} Tco_{k(DUT)} / L,$$

where $k_{DUT}$ is the number of the first bit of the output register to which DUT clock is connected; L is the number of DUT clock;

calculate compensation delay for each DUT clock driver as $Tcomp(DUTclk) = Tco(DUTclk) - \min<Tco>_n$.

A computer program can be easily created in any suitable language, e.g. C, C++, Assembler, etc, to implement the above sequence of steps on the basis of the above description.

The following errors may cause inaccuracy in the register's calibration.

Different registers may differ in their threshold level, causing uncertainty of their electric parameters. Using the method of calibration discussed above, it is possible to obviate or at least alleviate this problem.

Registers typically have threshold voltage of about 1.5–1.6V, while the threshold for SDRAM's is about 1.4V. This may also cause errors in determining the transition between "0" and "1" states. In this case, it is possible to calculate the error in determining the time difference between the moment when the register actually latches data and the reference clock edge, which is represented by the formula $$\Delta t_{trh} = \Delta U/r,$$

where $\Delta t_{trh}$—the addition to the time difference between the moment when a register actually latches data and a reference clock edge, caused by threshold voltage differences;

$$\Delta U = U\text{actual} - U\text{standard};$$

r—a signal's slew rate.

For the register's threshold voltages of about 1.5–1.6V, and SDRAM's threshold voltage of about 1.4V, as mentioned above, $\Delta U = 1.5V - 1.4V = 0.1V$; a signal slew rate r is about 2V/ns; thus, the uncertainty $\Delta t_{trh}$ is about 0.05 ns. In case U actual is 1.6V, the uncertainty will be even greater, i.e. about 0.1 ns, which constitutes a substantial part of the calibration accuracy. This is the systematic error that can be corrected as follows:

$$T\text{comp}_n = <T\text{co}_n> - \min<T\text{co}_n> - \Delta t_{trh}.$$

Another possible source of errors that must be taken into account when calibrating the registers at this step is the bushold circuit of the register that has a remnant memory of the preceding state of the register. Due to the existence of this remnant memory, the threshold values for the up-to-down and down-to-up transitions are different. This phenomenon causes a hysteresis loop in FIG. 3a. By measuring the loop width $\Delta t_{hys}$ it is possible to estimate the register's lowermost threshold uncertainty as follows:

$$\Delta T_{unc.eff.} = \Delta T_{unc.} \pm \Delta t_{hys}/2.$$

In FIG. 6 an example embodiment of the memory test system in accordance with the proposed invention is presented. The system shown is intended for testing a semiconductor memory 1 (DUT), for example SDRAM DIMM module. The system contains a timing means 2 for generating delay timing signals; a plurality 3 of drivers wherein at least one driver is a register, with a set 4 of phase shift means; a plurality 5 of receivers, wherein at least one receiver is a register, with a set 7 of phase shift means; a fault logic means 6; and a central control unit 8 connected to a computer interface 9.

The timing means 2 provides an appropriate sequence of addresses, data and control signals for accessing memory elements within the DUT 1 in accordance with the first step of the method of testing semiconductor devices proposed in the present invention. These data are fed to a set of input registers 3 whose function in the memory test system in accordance with one of the embodiments of the present invention is to maintain a predetermined standard level of logic signals including write data, addresses and control signals applied to the DUT 1. A set of pin drivers (not shown) may be used for conditioning logic levels to the needs of a specific DUT. A set 4 of phase shift means (e.g., programmable delay means) is used for calibration purposes to match the input timing of multiple test signal patterns. The read data obtained from the DUT are received by a set of receivers (e.g., output registers) 5 and compared with the predetermined levels of "0" and "1" in a fault logic means 6 to detect failures in the memory elements according to the next steps of the method of testing.

An analog comparator (not shown) may also be used before the output registers to compare the predetermined levels. From the output registers 5, the data in digital form are entered into a fault logic means 6 which compares real data with expected data coming from the timing means 2. Another set 7 of phase shift means (e.g., programmable delay means) for delaying received data to compensate the round trip delay, is used before the set 5 of receivers (e.g., output registers). The fault data from the fault logic means 6 are sent to the central control unit 8 and further to a computer interface 9 of a controlling computer (not shown) for processing test results according to the third step of the method of testing. The controlling computer preferably holds the accumulated data in an encoded format. The fault data may be represented also in a bitmap format for viewing the faults.

Instead of using conventional pin electronics for per-pin addressing of the DUT, the system shown in FIG. 6 uses two sets of registers, one for inputting data and another for receiving test data from the DUT. To achieve the strict accuracy required for testing high-speed semiconductor devices, conventional methods involve calibration of timings of each per-pin structure. The present invention avoids using time-consuming per-pin calibration by using a calibration means for calibrating registers thus enabling a fast per-register mode of calibration. In accordance with the present invention, the calibration operation may be performed both when the DUT is disconnected from the system, or, preferably, with the DUT connected to the test system. As the electrical characteristics of DUT itself may influence greatly the operation of the registers, it is highly important to be able to calibrate the test system by using the actual DUT to be tested, not by customary emulation of DUT characteristics.

Moreover, after the calibration operation is carried out in relation to the test system, the DUT registers may be calibrated as well. In this case the order in which the DUT registers are calibrated is not critical.

The present invention can also perform an analysis of DUT features, or any other integrated circuit device testing. For example, different DUT properties, e.g. electrical characteristics, may be examined in the course of the proposed test procedure. Thus, to determine the DUT pin capacitance, the calibration system is first calibrated as above. Then, a series of capacitors having predetermined capacitance values is tested using the same calibration system and measuring system parameters. The results obtained are plotted in the form of a calibration curve to determine the dependence of the system parameter P on the device capacitance, $P = f(C_{apacitance})$. The next step is to measure the same system parameter using a DUT to be tested in place of a capacitor. The desired DUT pin capacitance can be easily calculated from the calibration curve. As an alternative, a register in a memory test system or any other receiver coupled with a transmitter may be used.

Another example embodiment of the invention is particularly applicable to interfaces between integrated circuits and for high speed communications.

Figure 7:
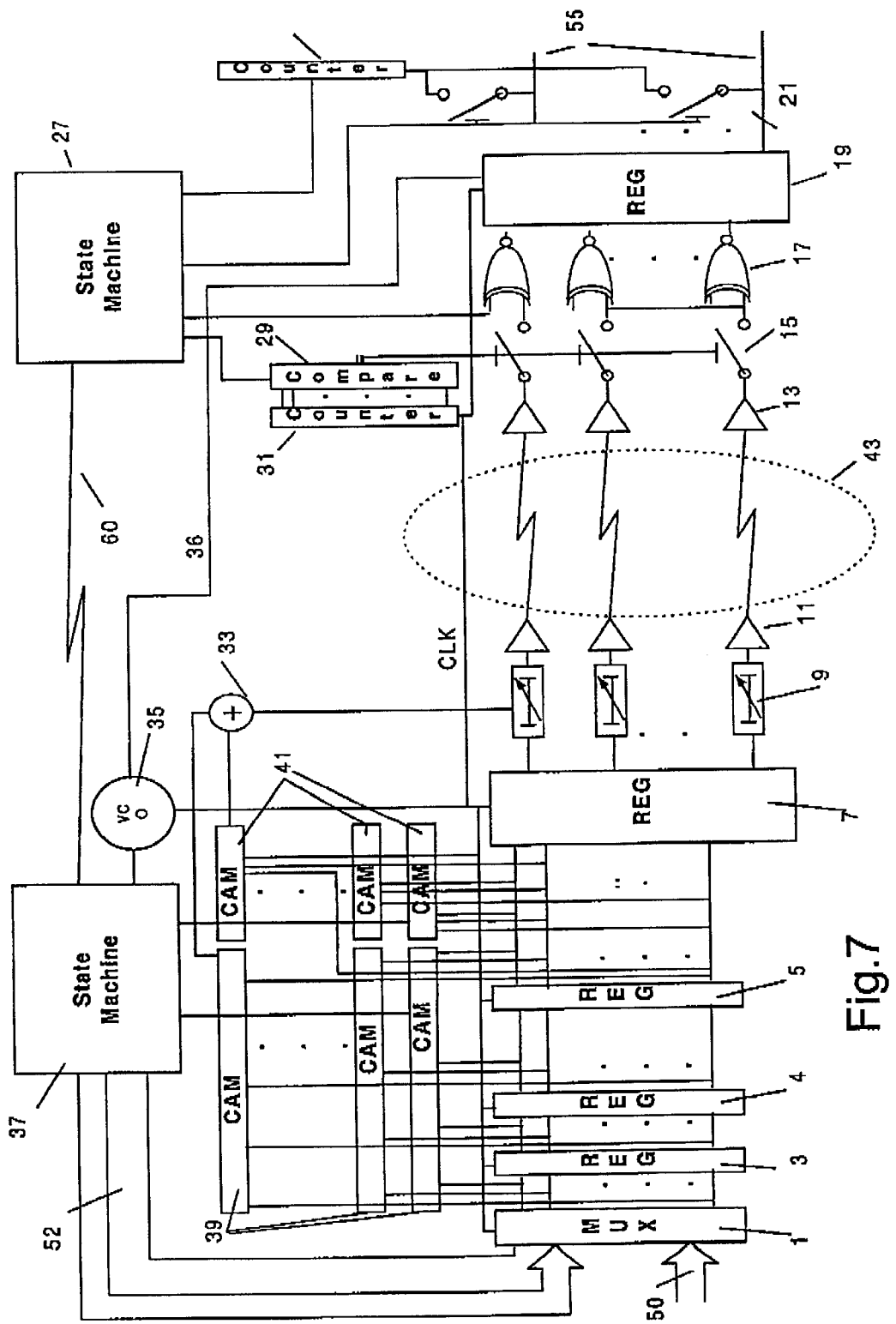
FIG. 7 shows a general block diagram of a timing uncertainty reduction system according to the second embodiment of the present invention.

In FIG. 7, this embodiment is illustrated in its most general form.

A timing uncertainty reduction system according to the invention comprises an input register 7 (which may equally comprise a plurality of registers), an output register 19 (which may comprise a plurality of registers as well), a main clock 35, a reference signal 36 associated with the main clock, for calibrating the registers, and a plurality of phase shift means, such as vernier devices 9 for the relative alignment of registers' 7 timing. The present embodiment of the invention is capable of compensating not only for the skew between signals on the output of the register (or, registers) 7, but also the skew caused by intersymbol interference, i.e. depending on the history of previously transmitted bits, and the skew caused by crosstalk between adjacent lines, using the same calibration method.

As shown in the figure, data 50 is presented as a plurality of signal wires into a multiplexer 1, which is controlled by a master state machine 37 such that it can select either the incoming data 50 or calibration data 52.

The data selected in the MUX then passes through a pipeline of registers 3, 4 and 5: only three pipe stages are shown but the number of pipe stages is preferably twice the number of symbols that are stored in transmission medium 43 due to the propagation delay of the medium.

The pipeline finishes in a register 7 which may or may not be part of the monitoring pipe, depending on the access time of the content addressable memories 39 and 41 (which may be implemented in Look Up Tables, or LUTs), plus the summation time 33, plus the write time to the verniers 9. Variable delays, such as verniers 9, may be incorporated into the data signal line, or into the clock line which clocks output data.

The pipeline feeds two sets 39, 41 of Look Up Tables (LUTs), wherein one set allocates one LUT 39 per signal wire, and the second set of LUTs wherein one LUT 41 is allocated across adjacent signal wires or in the ultimate case, all signal wires. Accordingly, shift registers or parallel registers may be used to address the lookup tables.

The purpose of the first LUT 39 is to use the data being sent to look up a correction value which is written into the LUT by the State Machine 37 during or at the end of the calibration process to correct for skew caused by intersymbol interference.

The purpose of the second LUT 41 is to use the data being sent to look up a correction value which is written into the LUT by the State Machine 37 during or at the end of the calibration process to correct for skew caused by cross-talk and other effects in neighbouring signals.

The register 7 at the end of the pipe and the receiving register 19 should have low variations with temperature and other factors. The output of the transmitter register 7 feeds into a bank of vernier delays 9, with the delay setting determined by the composition, for example, such as by the summation of the delay values in each of the LUTs that relate to that signal wire. In the figure only one summation unit 33 is shown for reasons of clarity but each pair of LUTs 39 and 41 has a summation unit which feeds in a similar fashion to the appropriate vernier.

The verniers delay the signals being sent into the transmission line 43 via buffers or drivers 11.

The verniers may be located at the far end as an alternative to or in addition to locating them at the transmitting end.

At the receiving end, the signal may be buffered by buffers 13, then pass through a switch and an EXOR gate which is used in the calibration process, into a receiving register 19. The purpose of the gate 15 shown in idealised form in FIG. 7 is to place a time window on the data during calibration so that the effect of timing anomalies can be determined for each bit of a known data stream. The gates 15 may be NOR gates or NAND gates or any other gating function that has the functional equivalence of a switch. The EXOR gates 17 are needed in some implementations to invert the incoming data stream. Any other form of selective inversion may be used.

The data, after being latched by the receiving register 19, enters the system for use as a data channel 55, but may also be switched to a counter 23. An analogue alternative to the counter is a low pass filter and integrator.

The output of the counter is fed into a receiving State Machine 27. This same state machine controls the gating of data during a calibration process, such as by the use of a counter 31 and comparator 29 which is operated synchronously to gate in a specific data bit from a serial stream to the register 19 and gate out data bits that are not of interest in a particular calibration step.

The second or Slave State Machine 27 can communicate with the Master State Machine 37 either using the communication channel in a transceiver mode or using additional wires 60. The speed of this communication between state machines is very low in comparison with the data rate of the channel and latency is not of significant interest so any type of communication channel can be used for this connection between the state machines. The master State Machine 37 controls the system clock using a source of a periodic signal of a variable precision frequency 35, for example a frequency synthesiser comprising VCO, divider chains, stable frequency reference and phase comparator such as a Synergy SY89S429. Alternatively or in conjunction with the variable frequency source, the master State Machine controls the data pattern during calibration 52.

The two state machines form a feedback loop.

The state machines together form a central control unit and run a calibration method according to the invention as has already been described in detail above whereby different frequencies or data patterns are used to determine the time between two edge events in terms of the actual delay of logic elements. In this process, a voltage controlled oscillator 35 is preferred.

The LUTs are each of a very small size, for example 3 bits or five bits wide in their address for the LUTs that correct for cross talk and twice as long in address as the number of bits in the transmission medium, for example 10 bits in a processor to memory interface application running at 5 G transfers per second across a 128 bit wide interface. The delay variation can be for example 6 bits or 8 bits, so the total amount of memory need in this application is low and the area taken by this memory in silicon is tiny. Hence, a memory 3 bits wide with 6 bits of data at each address, is only 18 bits. For a 128 bit wide interface, this memory is less than 2K bits for the entire interface.

The LUTs are simply normal memory devices or structures where a short address is used to index a delay value.

The transmission medium 43 can be any material including conducting wires, optical fibres, or any other medium. In the case of optical communications, there is negligible cross coupling and reflections can be ignored in many instances. This leaves the inherent timing errors of the driver and receiver, which can be reduced to the difference in transmission between two symbols, as well as the skew thereof. The skew in the fibre is no longer pattern dependent from data line to data line, but still requires correction. The methods used currently involve passing all possible patterns into the channel and measuring the response. The present invention makes possible a much more accurate correction based on the actual temporal characteristics of the components and their interconnect.

Operation

The operation of this system shall now be described in detail. The field of the present invention is highly specialised and therefore, the following briefing material is provided to aid the reader to understand the significance and true operation of the current invention, without prejudice or limit to the description of the invention.

The practical capacity of the channel is a function of the maximum toggle rate of the registers, the skew of the data, the variation in the clock to output delay of the transmitter and variation in the setup and hold time for the receivers.

The actual achievable toggle rate of a register or its maximum clock frequency has inherent to it a number of factors: the setup and hold time, the location and width of the phase noise distribution as well as various propagation and switching delays. If all other factors are removed, the toggle rate is the time it takes for a pulse to propagate around the gates of the feedback loop in the register. If the variations in factors such as the setup and hold time are reduced or eliminated, then the maximum toggle rate can be equivalent to between four and six gate delays. As gate delays reduce as the square of reductions in feature size, we can estimate the increase in toggle rate for registers to increase as shown in table below.

| Feature size (nm) | Gate delay (ps) | Toggle rate (GHz) |
| --- | --- | --- |
| 300 | 150 | 1.1 |
| 180 | 54 | 3.1 |
| 130 | 28 | 5.9 |
| 70 | 8 | 20.4 |

All numeric values given in these examples are given for CMOS technology, as this is at present the most widely available and lowest cost solution for the implementation of any communications channel. Other technologies such as GaAs or InPh (Indium Phosphide) have a different switching rate: their higher electron mobility will enable them to switch faster, hence toggle rates can be several times faster for the same feature size.

The primary difference between technologies, that affect the maximum rate of the communication channel using the present invention, is their relative switching speed. To scale from CMOS to, for example, GaAs at the same feature size, one need only multiply the maximum frequency of switching speed related limits by the ratio of the electron mobilities. For example, the toggle frequency of a GaAs device fabricated in a 300 nm feature size technology should be around 3.1 GHz instead of 1.1 GHz for the equivalent CMOS device. However not all the limits to switching speed scale evenly and these limits would reduce some of the advantages of esoteric materials over CMOS.

Given that the toggle rate is predetermined by the fabrication process and that the effect of variations of setup and hold time can be eliminated, this leaves the signal skew as the primary limiting factor in the capacity of a channel and it is this limit that the present invention addresses.

The following factors that determine skew are considered in the present invention:

1. Variations in the sample and hold time or clock to output time of different bits and different registers in a wide channel.
2. Impedance mismatch. As each bit passes a discontinuity, a portion of the incident energy is reflected. This changes the forward slew rate as it reduces the value of the forward voltage, and the energy thus subtracted is then added to each successive symbol in the transmission medium until the reflection is absorbed by terminating components or other damping means. Thus an impedance discontinuity causes a skew on a signal with respect to a reference.
3. Electrical noise. This has a similar effect to the impedance discontinuity in adding energy to the signal, which can either increase or decrease its momentary voltage or current, causing a change in the time for that signal to cross a predetermined threshold value used for switching. The noise has many sources and combines pink and white noise profiles.

Each one of the factors described above has an effect on the probability of a bit being received correctly. In the design of a channel these effects are analysed for their distribution and the degree of correction needed and the resolution of that correction is determined. This process will now be described in more detail.

Figure 8:
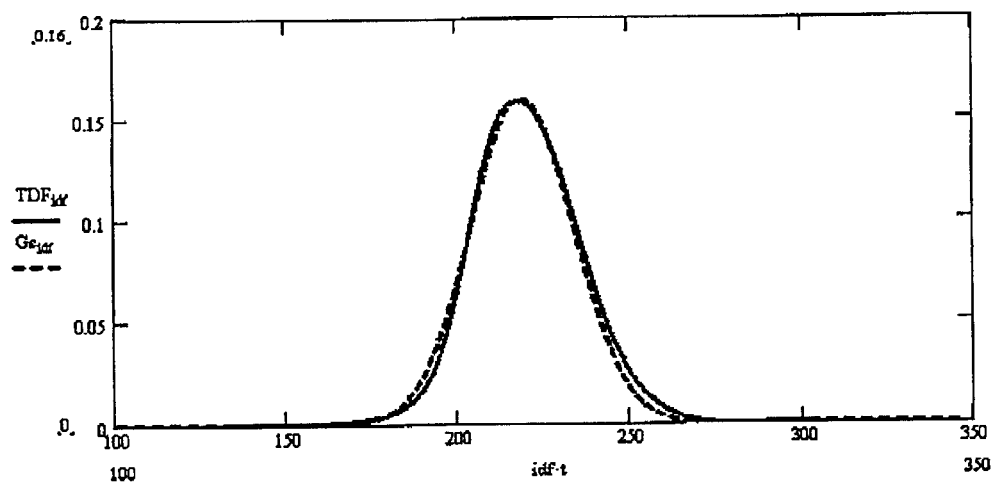
FIG. 8 shows the phase noise characteristic, both ideal and actual for a common component, a SSTL16857 register with input noise, with relative time in pico seconds in the X axis and probability density of receiving the wrong bit with a scaling factor in the Y axis.

All registers have a probability density distribution for the register being in a 0 or a 1 state as a function of the time offset of the clock to data. FIG. 8 shows the actual probability density distribution for one such register, an SSTL register: the dotted line is the closest fit of a Normal distribution, the solid line represents measurements taken at sub-pico second accuracy and resolution.

Figure 10:
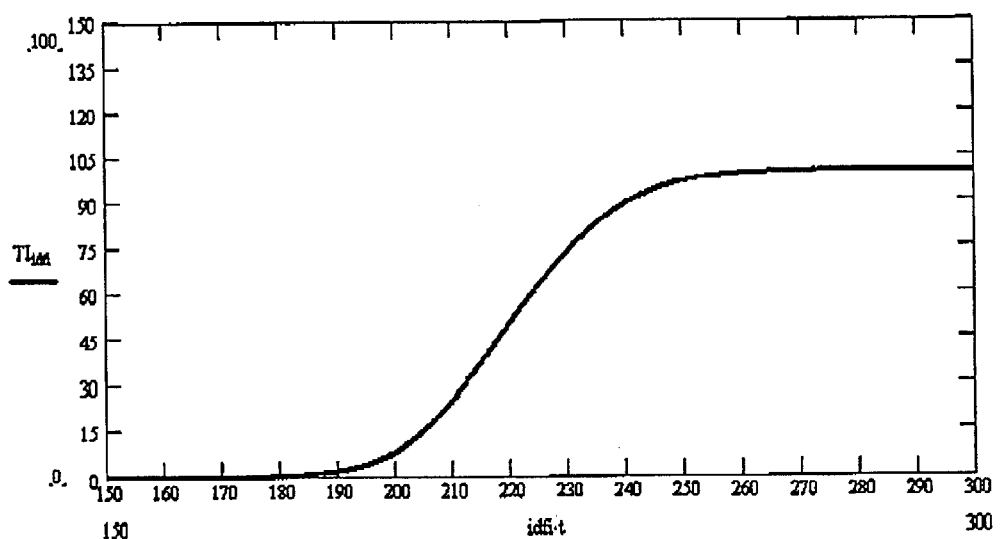
FIG. 10 shows an example of the probability of a signal being latched as a 1 by a register as a function of a timing offset.
Figure 11:
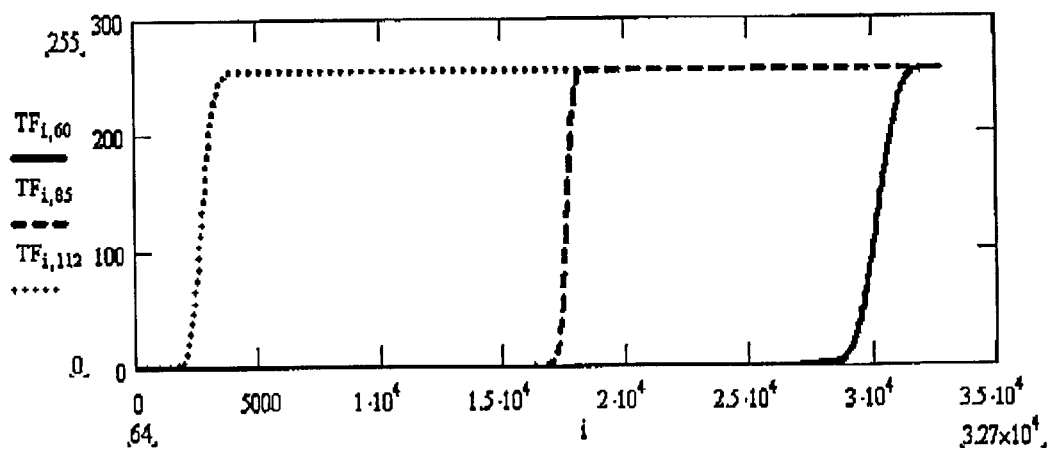
FIG. 11 shows an example of a variation in the probability of a signal being latched as a 1 as a function of the data, namely the frequency at which the data changes.

The BER contribution from a component can be measured from the timing uncertainty distribution curve for the component, such as shown in FIG. 4a and FIG. 10. The communication channel operates with a predetermined time window around when the transition occurs.

FIG. 10 shows the time of a transition for an SSTL16857 register, measured with an accuracy of a fraction of a pico second, against the probability of the signal being latched as a 0 or a 1. The Standard Deviation on the transition point on this register is 20 ps. If this register is used in a communication channel with it latching data every 200 ps (20 ps×2×5 sigmas), the BER from this component will be $1.5 \times 10^{-12}$. It is by a determination of this nature that the number of steps in the calibration process and the accuracy needed in that process is determined.

Figure 9:
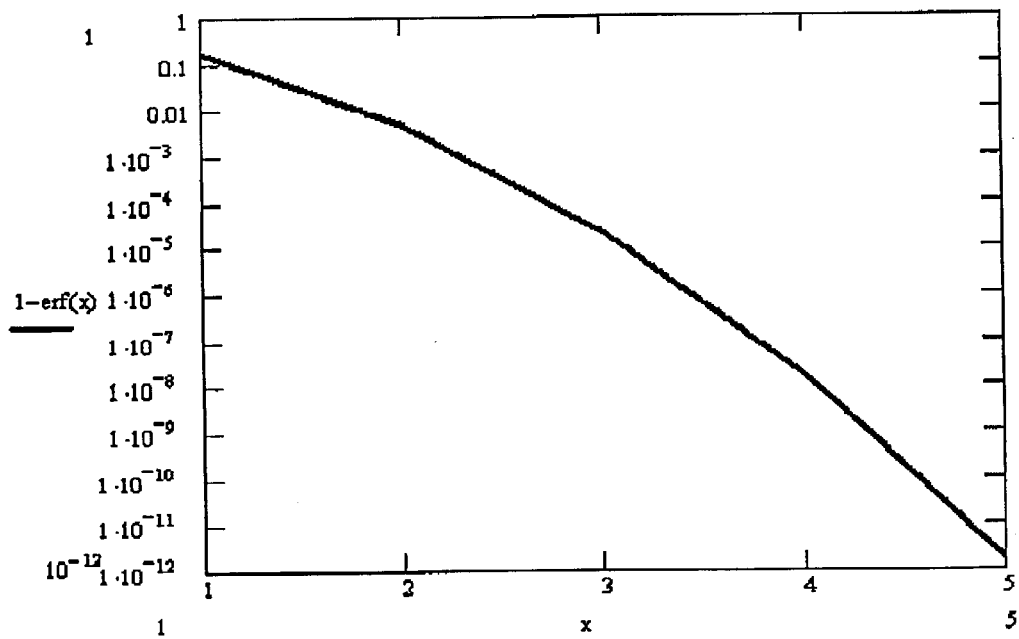
FIG. 9 shows the Bit Error Rate (BER) as a function of the number of standard deviations of a normal distribution, from which a temporal operating window is chosen.

The BER of a single data path or line within a channel for a given data rate can be calculated by taking the timing uncertainty distribution curve for every component both along a line of a channel taking the square root from the sum of the squares of the RMS of the distributions, to arrive at a distribution curve for the line as a whole. The channel BER is the sum of the BERs of each line. The BER is one minus the integral of this curve, as tabulated in FIG. 9. The tighter the distribution for each component of the channel, then the lower the BER at any given frequency, or the higher the frequency at which the channel can operate.

For each of the effects that are not being compensated, the distributions are summed by the RMS of their distributions, the root is taken and an overall distribution is determined. From this the frequency at which data can be sent reliably is determined and the number of steps in the verniers is chosen.

It is necessary for the accurate and unambiguous description of the operation of the present invention to clarify what the Setup and Hold times of the registers mean.

Setup and Hold time is the total time covering all variations in the phase noise maxima from part to part, from DQ to DQ, with variations in temperature, process variation and power supply voltage plus any settling time. In a receiver the whole actual Setup and Hold period is relevant. In a transmitter the clock to data output delay is considered rather than the Setup and Hold term of the register, again with variations that arise as a result of changes of temperature, phase noise and fabrication tolerances.

Registers may exhibit true metastability where the register exhibits an exponential increase in the clock to output time as a particular clocking point is approached or they may simply exhibit phase noise. The registers in the present invention are clocked at a high speed, so whether the register is metastable is immaterial: the next clock cycle resolves the metastable state. Metastability manifests itself as phase noise in this context. See "Metastability and the ECLinPS Family" by Rennie Wm. Dover and Todd Peason, AN1504, Motorola Inc., 1996; and also "High-Speed Digital Design" by Howard W. Johnson and Martin Graham, Prentice Hall, 1993, Englewood Cliffs, N.J. 17632.

The time window in which there is a significant probability of metastability, or the time window in which there is significant phase noise in a register, is normally very small, but the variation in this time gives rise to very large brackets which are expressed as long setup and hold times or clock to output delays.

The present invention applies the phase noise to a feedback system to control the channel, ensuring it operates on or close to its region of maximal stability, this being 180 degrees out of phase from the peak of the phase noise distribution.

Use of the current invention has enabled the inventors to take measurements of phase noise distributions with accuracies of fempto-seconds and even atto-seconds. The information from this analysis is described here to explain how the calibration process used by the present invention operates.

The width of the true phase noise distribution is the comparable to the phase noise of a sample-hold function implemented in the same technology with the same charge storage, assuming all drift in that function is controlled.

Figure 12:
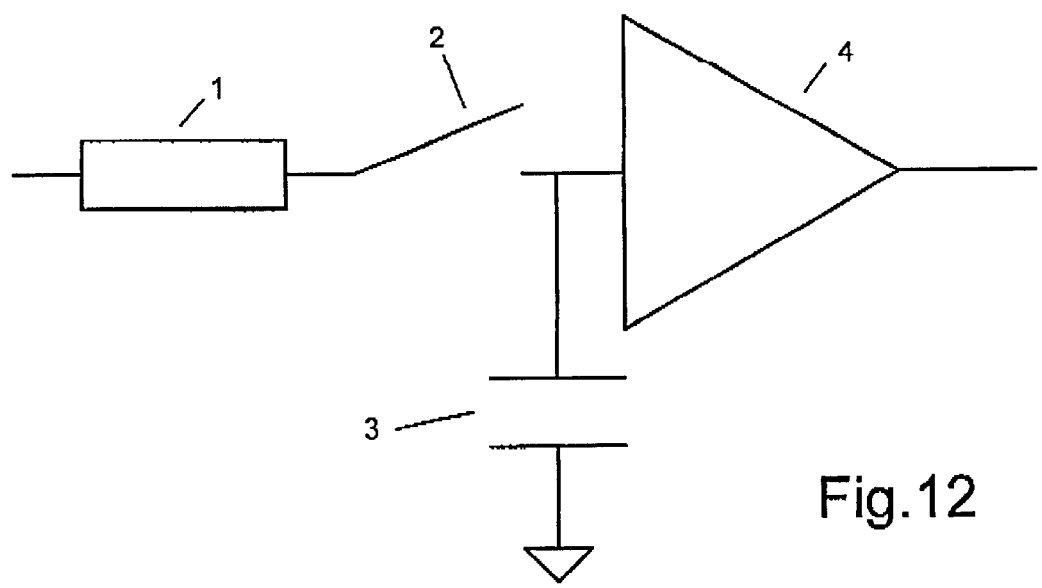
FIG. 12 shows a simple sample—hold circuit.

A sample-hold circuit such as that shown in FIG. 12 comprises a gate driving a capacitor, followed by a buffer. The uncertainty in opening the gate is a function of the slew rate of the HOLD signal, the noise on the HOLD signal, the gain of the gating transistor and the switching speed of the gate. This effect is not metastability at all: it is simply the sampling of a signal which is undefined in time by the noise distribution on the HOLD line and gating transistor. In the case of the sample and hold circuit, the timing uncertainty comes from noise in any input buffer, noise in any command line buffer to the gate, and particularly the gating transistor switching time.

This means that when we measure the phase noise characteristics of a register, we are actually measuring the switching time characteristics for the internal circuitry that comprises the register plus input noise.

The phase noise distribution, appears to manifest a slightly less than linear reduction in the time domain as a function of reducing feature size. If one estimates the resulting function as a reduction proportional to the ratio of feature sizes to a power of 0.75, then the Standard Deviation for the timing uncertainty is expected to reduce from around 20 ps to 12 ps as technology moves from 300 nm to 70 nm.

| Feature size (nm) | Standard Deviation of Timing uncertainty window (ps) |
| --- | --- |
| 300 | 20 |
| 180 | 14 |
| 130 | 11 |
| 70 | 7 |

Taking the 70 nm process, and operating with Sigma 6 BERs, the fastest data rate that can be supported is a transition every 42 ns. This is the ultimate rate of data transmission for a serial interface with clock recovery, or for each bit of a parallel system where all skew is completely eliminated.

Operating at a higher BER would allow a higher data rate. For example using Viterbi encoding and decoding of each data line could allow the system to operate at Sigma 4 BERs per bit in the extreme case (the data rate being half this, i.e. Sigma 2, i.e. one error every 200 bits—at the limit of the range that is easily correctable), which would mean the maximum data rate is a change every 28 ps, or just over 35 GHz.

In the examples shown in FIG. 7 and FIG. 8, the time window for the register in a channel which is, for all useful purposes, free of errors, would be 210 ps (6 Sigma).

Typically, the phase noise of the register has two components: the position of its maxima, and the window around the phase noise maxima. The register without any means of controlling the position of the phase noise maximum could take data at less than 500 MHz, even if it arrived without skew.

The Operation of the present invention involves two steps:
1. Calibration
2. Data transfer.

The Calibration step uses the method as described above to determine the time delay between the transition of a clock signal and the registering of a data signal in a register, particularly register 19 in FIG. 7.

The current invention implements the process described above to determine the time delays with very high accuracy, for example an application may chose to measure the time delays to ten pico-second accuracy, another very exacting application may require fempto-second accuracy.

The master state machine changes the delay within the delay vernier 9, to cause the data bit to switch at the correct point in time.

The use of two or more frequencies to resolve the unknown variables is evident from the above description of the method of the present invention. The change in frequency is chosen as the preferred reference means because the frequency of timing sources can be set extremely accurately in a frequency synthesiser.

Once the delay values are known for a particular combination of bits, the values are written to the appropriate LUT: the LUT depends on which variables are altered and the data pattern being generated by the state machine.

This first mode of operation is preferably carried out during the system reset phase but may be repeated. In a preferred embodiment, the LUT may have two parts, one being a non-volatile memory, the second being volatile memory, such that the entire calibration may be done only once at the end of the manufacturing process, but a fine tuning over a much smaller range is performed during power up. In some cases it is possible to perform the calibration only once, then use the calibration data throughout the life of the product.

The second mode of operation for the present invention is to send the data.

For each data word, the delay of the present bit is calculated by the master state machine applying a repetitive sequence and the symbol of interest being gated out.

It is necessary for the calibration process to first determine which symbol is which, as the delay in the transmission line is unknown at the outset. This can be achieved by various techniques, among the simplest being to send a clock signal down all data lines at a rate low enough to exceed the total timing uncertainty distribution curve with the required accuracy, for example using Sigma 4 with averaging or Sigma 6 without. For example, a system with a composite probability distribution for the receipt of a bit of 1 ns, could initiate the calibration process by using a data stream with an equivalent frequency of 96 MHz, using this frequency and 60 MHz not to determine the total loop delay but to set a reference edge by which all other data bits can be measured. In this manner the position of each of the bits in time in the receiver relative to the transmitter can be determined.

Once the position of a reference edge has been determined by the above process, the position of other bits in the stream can be determined by counting the clock cycles using a controlled counter and comparator, or using extra protocol information between the two state machines, or even by judicious selection of frequencies and data patterns for the calibration.

Where the access time of the LUTs is long, the transmitter register 7 may require to include more than one pipe delay.

The vernier delays are shown in the transmitter in this embodiment, but the delays can be in the receiver and the receiver can act as the master in the calibration process.

The method of determining the time in which a transition occurs will now be explained in further detail.

Consider a channel comprising simply of a set of drivers and a set of receivers.

The timing of each drive register and receiver register is controlled by a precision Vernier delay, for example with 20 ps resolution.

Figure 13:
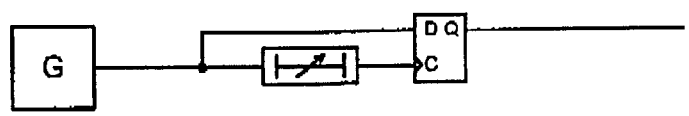
FIG. 13 shows a simplified delay calibration configuration.

The calibration procedure consists of the following steps:
1. Calibration of the Delay Verniers
2. Calibration of the Receiving Registers
3. Calibration of the Driving Registers
4. Adjustment of the Delay Verniers In a diagram of FIG. 7, the skew measuring configuration is shown, which can be applied either to the input register (or, registers) 7 or output register (or, registers) 19. A simplified diagram of skew measurement is shown in FIG. 13, where G is a Phase Locked Loop (PLL) variable over the range such as 1 GHz to 5 GHz, can be used. Phase jitter is typically less than 0.05%, and this is compensated during calibration.

All steps of the calibration procedure are based on the following skew-measuring equation:

$$T_D = T_0 + \tau * N$$

where $T_D$ is the Vernier delay, $T_0$ is the minimum delay, $\tau$ is the discrete interval of the delay settings and N is the programmed code.

Calibration Step 1

Figure 14:
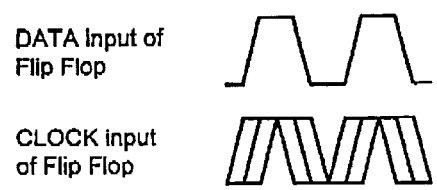
FIG. 14 is a timing diagram.

In the first step of the calibration process, the calibration of the delay verniers 9, the period of the PLL is set to a value less than the interval of the delay vernier, as shown in FIG. 14.

Note that while a PLL is used, this does not affect the measurement. The accuracy of the PLL depends on the accuracy of the quartz crystal resonant frequency, which is typically better than 1 in 100,000, and its own noise figure of less than 0.05%. As the calibration is performed at frequencies in the 100 MHz to 10 GHz region, this tolerance created by the frequency uncertainty and by jitter is many times less than the typical 20 ps to 1 ps resolution of the regulating Vernier delay.

Calibration Step 2

The value of the vernier delay is then scanned from its minimum to maximum, sampling the output of the flip-flop many times. This allows the point at which the flip-flop has a transition to be determined. At this point, $T_D$ will be equal to the period of the generator:

$$T_{D1} = P_1 = T_0 + \tau * N_1$$

Calibration Step 3

The period of the generator is then changed and the procedure described above repeated to find the next point where the flip-flop has a peak in its phase noise characteristic, that is the highest probability of the transition occurring within the register. Thus:

$$T_{D2} = P_2 = T_0 + \tau * N_2$$

After this step $T_0$ and $\tau$ can be easily calculated.

Repeating this procedure for each Delay Vernier allows all of them to be calibrated. In each measurement, there are many samples, such as 256. This increases the overall frequency accuracy by a further factor of the square root of the number of samples, for example by 16 (the square root of 256), so even a 20 ps resolution increases to a measurement accuracy of 1.25 ps overall.

Calibration Step 4

The receiving registers are then calibrated in the same way. Because the Delay Verniers are now precisely calibrated it is possible to find the difference in the timing of the peak of the phase noise for each receiving flip-flop individually.

Calibration Step 5

The driving registers are then calibrated using the previously calibrated Delay Verniers and receiving registers.

Calibration Step 6

The software compensation for differences in PCB trace lengths is added to the calibration results. This compensation uses the trace lengths taken from the actual PCB layout software and can be hard programmed or can be set in a non-volatile memory for the whole system, for example a serial presence detect memory device or integrated on the same chip as the communication channel.

Calibration Step 7

At the end of the calibration process the delays in the signals coming to a node and from the node for each bit have been measured.

The Delay Verniers can be adjusted in order to eliminate the part to part skew in the driving and receiving registers. Only the skew within the device is not compensated for, but because it has been measured it can be taken into account by the state machine software. This means that the entire system is calibrated with a total absolute accuracy of 20 ps, and relative accuracy of 1.25 ps accuracy if 256 samples are taken.

Precision registers can be used which have only a 10 ps window for the skew within the register, in which case the accuracy of the system using this technique on its own is 20 ps (the increment on the Delay Vernier). It is possible to reduce this error down to fempto second levels by oversampling, using basic sampling theory.

This process can be repeated to achieve higher levels of time accuracy, in particular when the time taken to transmit a bit is not known. This information is necessary to apply symbol by symbol selection and gating during the calibration process where this is used.

It will be appreciated that the above description and the figures are an example embodiment only and that various modifications may be made to the embodiment described above within the scope of the present invention.

What is claimed:

1. An apparatus for high speed communication, comprising:
   a plurality of driving registers, each driving register having a plurality of inputs and outputs, at least one output of each said driving register connectable to at least one communication line, said driving registers latching transmitted signals;
   a plurality of receiving registers, each receiving register having a plurality of inputs and outputs, at least one input of each said receiving register connectable to at least one said communication line, said receiving registers latching received signals;
   a main clock for generating a main clock signal;
   a reference clock for generating a reference signal for calibrating the receiving registers; said reference clock being associated with said main clock;
   a first set of phase shift means associated with said plurality of driving registers, for the relative alignment of the driving registers' timing within the plurality of driving registers.

2. The apparatus according to claim 1, further comprising a common transmission line of known signal propagation rate for supplying the said reference signal.

3. The apparatus according to claim 2, wherein each of said receiving registers is connected to said reference clock by said common transmission line of known signal propagation rate.

4. The apparatus according to claim 1, wherein each of said phase shift means is pre-calibrated by varying a calibration frequency.

5. The apparatus according to claim 1, wherein said phase shift means comprises at least one of: a variable delay, a programmable delay, an analogue vernier, a digital vernier.

6. The apparatus according to claim 1, wherein each of said receiving registers for latching signals received from said communication line is pre-calibrated by determining a minimal feasible time delay between the reference clock edge and a moment when the register latches data.

7. The apparatus according to claim 1, further comprising a second set of phase shift means associated with said plurality of receiving registers, for relative alignment of the receiving register's timing within said plurality of receiving registers.

8. The apparatus according to claim 1, further comprising a storage means for recording and storing information on skew in a communication media, for at least one data pattern transmitted through the communication line.

9. The apparatus according to claim 8, further comprising a plurality of adjustment means for generating and applying a correction to the timing position of a signal transition between two logical levels, the correction being generated on the basis of the information stored in the storage means, so as to compensate the above skew.

10. The apparatus according to claim 1, further comprising a third set of phase shift means associated with said pluralities of driving and receiving registers, for relative alignment of the register's timing between said pluralities of driving and receiving registers, said pluralities of registers being connected to the main clock via said third set of phase shift means.

11. The apparatus according to claim 10, wherein said third plurality of phase shift means comprises at least one shift means associated with each of the said pluralities of driving and receiving registers.

12. The apparatus according to claim 1, wherein the driving registers and receiving registers are interconnected so that outputs of driving registers are connected via respective communication lines to the inputs of respective receiving registers to calibrate said plurality of driving registers.

13. A method for reducing timing uncertainty of a communication apparatus, comprising:
    calibrating a plurality of receiving registers of the communication apparatus using at least one set of programmable delays, each of said receiving registers being connectable to at least one communication line, in relation to a reference clock edge;
    calibrating a propagation delay of a plurality of driving registers of the communication apparatus, each of said driving registers being connectable to said at least one communication line, using the calibrated receiving registers; and
    performing relative alignment of the programmable delays to a main clock edge.

14. The method according to claim 13, further comprising calibrating a respective programmable delay for each receiving register before calibrating the receiving registers.

15. The method according to claim 14, wherein the programmable delays are pre-calibrated by varying a calibration frequency and fixing the difference in time of the two transition moments.

16. The method according to claim 13, wherein the accuracy of at least one of calibration of the receiving registers and calibration of the driving registers is increased by determining for at least one of the receiving and driving registers, a minimal feasible time delay between the reference clock edge and a moment when at least one of the receiving and driving registers latches data.

17. The method according to claim 16, wherein the determination for minimal feasible time delay is performed twice, once for the falling edge of said reference clock, and again for the rising edge of said reference clock.

18. A method according to claim 13, wherein the propagation delay of each of the driving registers is calibrated by varying delays to best match an output transition with a latch time of at least one of said receiving registers.

19. The method according to claim 13, wherein the propagation delays are calibrated for each individual bit of the receiving register data.

20. The method according to claim 13, further comprising transmitting of data through the communication line provided by at least one driver and measuring a skew for at least one data pattern transmitted through the communication line.

21. The method according to claim 13, further comprising recording and storing information on skew in said at least one communication line, for at least one data pattern transmitted through the communication line.

22. The method according to claim 21, further comprising generating and applying a correction to the timing position of a signal transition between two logical levels, the correction being generated on the basis of the stored skew information, so as to compensate the above skew of the communication line.

23. The method according to claim 22, wherein the information is stored on skew caused by inter-symbol interference in the transmission media.

24. The method according to claim 22, wherein the information is stored on skew caused by cross-talk influence in the transmission media.

25. The method according to claim 13, wherein said receiving registers are calibrated with reference to a periodic reference clock edge.

26. The method according to claim 13, wherein at least one of the calibration of the receiving registers and the calibration of the driving registers is partially or completely computer implemented.

27. A computer readable medium including a computer readable program means for implementing or simulating hardware functions of a communication apparatus comprising:

a plurality of driving registers connectable to at least one communication line, said driving registers latching transmitted signals;

a plurality of receiving registers connectable to said at least one communication line for latching signals received from said communication line;

a main clock for generating a main clock signal;

a reference clock for generating reference signals for calibrating the receiving registers; said reference clock being associated with said main clock;

a first set of phase shift means associated with said plurality of driving registers, for the relative alignment of the driving registers' timing.

28. A timing uncertainty reduction system for calibration of a high speed communication apparatus, comprising:

at least one driving register for latching transmitted signals, each said driving register having a plurality of inputs and outputs;

at least one receiving register for latching received signals, each said receiving register having a plurality of inputs and outputs;

a main clock for generating a main clock signal;

a reference clock for generating a reference signal for calibrating the receiving register or registers; said reference clock being associated with said main clock; and a first set of phase shift means associated with said driving register or registers, for the relative alignment of the driving signals' timing.

29. The system according to claim 28, further comprising a storage means connected to said at least one driving register or at least one receiving register for recording and storing information on timing uncertainty in a communication media, for at least one data pattern transmitted through the communication media.

30. The system according to claim 29, further comprising a plurality of adjustment means for generating and applying a correction to the timing position of a signal transition between two logical levels, the correction being generated on the basis of the information stored in the storage means, so as to compensate the above timing uncertainty.

31. The system according to claim 29, wherein the information on timing uncertainty is stored on skew caused by inter-symbol interference in the communication media.

32. The system according to claim 29, wherein the information on timing uncertainty is stored on skew caused by cross-talk influence in the communication media.

33. The system according to claim 30, wherein the correction is applied using said first set of phase shift means.

34. The system according to claim 30, wherein the correction is applied using a second set of phase shift means associated with said plurality of receiving registers, for relative alignment of the receiving register's timing within said plurality of receiving registers.

35. The system according to claim 28, further comprising a common transmission line of known signal propagation rate for supplying the said reference signal.

36. The system according to claim 28, wherein each of said receiving registers is connected to said reference clock by said common transmission line of known signal propagation rate.

37. The system according to claim 28, wherein each of said phase shift means is pre-calibrated by varying a calibration frequency.

38. The system according to claim 28, wherein each of said receiving registers for latching signals is pre-calibrated by determining a minimal feasible time delay between the reference clock edge and a moment when the register latches data.

39. A computer program product for implementing a method of reducing timing uncertainty of a communication apparatus, said computer program product comprising a computer usable medium having computer readable program code means embodied thereon, said computer program code means comprising a computer readable program code means for causing a computer to perform transmitting of data through at least one communication line provided by at least one driver and measuring a skew for at least one data pattern transmitted through the communication line;

a computer readable program code means for causing a computer to perform recording and storing information on skew in said at least one communication line, for at least one data pattern transmitted through the communication line;

a computer readable program code means for causing a computer to perform generating and applying a correction to the timing position of a signal transition between two logical levels, the correction being generated on the basis of the skew information of the communication line, so as to compensate the above skew;

a computer readable program code means for causing a computer to perform calibration of a plurality of receiving registers of the communication apparatus using at least one set of programmable delays, each of said receiving registers being connectable to said at least one communication line, in relation to a reference clock edge;

a computer readable program code means for causing a computer to perform calibrating a propagation delay of a plurality of driving registers of the communication apparatus, each of said driving registers being connectable to said at least one communication line, using the calibrated receiving registers; and a computer readable program code means for causing a computer to perform relative alignment of the programmable delays to a main clock edge.

* * * * *